US007408811B2

(12) United States Patent
Shirota et al.

(10) Patent No.: US 7,408,811 B2
(45) Date of Patent: Aug. 5, 2008

(54) NAND-TYPE FLASH MEMORY ON AN SOI SUBSTRATE WITH A CARRIER DISCHARGING OPERATION

(75) Inventors: Riichiro Shirota, Fujisawa (JP); Fumitaka Arai, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/401,937

(22) Filed: Apr. 12, 2006

(65) Prior Publication Data
US 2006/0245251 A1 Nov. 2, 2006

(30) Foreign Application Priority Data
May 2, 2005 (JP) .............................. 2005-133946

(51) Int. Cl.
*G11C 16/02* (2006.01)
*G11C 16/06* (2006.01)
(52) U.S. Cl. ...................... 365/185.25; 365/185.17; 365/185.18; 365/176; 365/204
(58) Field of Classification Search .......... 365/185.17, 365/185.18, 185.25, 176, 204, 185.19, 185.31; 257/347, E27.112
See application file for complete search history.

(56) References Cited

U.S. PATENT DOCUMENTS

| 5,589,699 | A | * | 12/1996 | Araki | 257/316 |
| 5,691,552 | A | * | 11/1997 | Oyama | 257/316 |
| 5,796,142 | A | * | 8/1998 | Lin et al. | 257/316 |
| 6,049,482 | A | * | 4/2000 | Aritome et al. | 365/185.24 |
| 6,115,287 | A | * | 9/2000 | Shimizu et al. | 365/185.17 |
| 6,830,963 | B1 | * | 12/2004 | Forbes | 438/149 |
| 2002/0179964 | A1 | * | 12/2002 | Kato et al. | 257/316 |
| 2004/0240269 | A1 | * | 12/2004 | Cernea | 365/185.12 |
| 2005/0057966 | A1 | * | 3/2005 | Nazarian | 365/185.01 |
| 2005/0226055 | A1 | * | 10/2005 | Guterman | 365/185.28 |
| 2006/0245251 | A1 | | 11/2006 | Shirota et al. | |

OTHER PUBLICATIONS

U.S. Appl. No. 11/549,770, filed Oct. 16, 2006, Shirota et al.
U.S. Appl. No. 11/841,257, filed Aug. 20, 2007, Mizukami et al.
U.S. Appl. No. 11/947,008, filed Nov. 29, 2007, Nishihara et al.

* cited by examiner

*Primary Examiner*—J. H. Hur
(74) *Attorney, Agent, or Firm*—Oblon, Spivak, McClelland, Maier & Neustadt, P.C.

(57) ABSTRACT

A semiconductor memory device includes: a semiconductor layer provided on an insulating substrate or an insulating layer; active areas each defined in the semiconductor layer with a device insulating film buried therein; and NAND cell units formed on the active areas, each NAND cell unit including a plurality of electrically rewritable and non-volatile memory cells connected in series, both ends of each NAND cell unit being coupled to a source line and a bit line, wherein the device has such a carrier discharging mode as to discharge channel carriers in the NAND cell unit to at least one of the source line and the bit line.

16 Claims, 15 Drawing Sheets

NAND-TYPE FLASH MEMORY ON AN SOI SUBSTRATE WITH A CARRIER DISCHARGING OPERATION

CROSS-REFERENCE TO RELATED APPLICATION

This application is based on and claims the benefit of priority from the prior Japanese Patent Application No. 2005-133946, filed on May 2, 2005, the entire contents of which are incorporated herein by reference.

BACKGROUND OF THE INVENTION

1. Field of the Invention

This invention relates to a semiconductor memory device with electrically rewritable and non-volatile memory cells, especially to an EEPROM with NAND cell units formed on an SOI substrate.

2. Description of Related Art

A NAND-type flash memory is known as one of EEPROMs (electrically erasable and programmable ROMs). A NAND-type flash memory is formed of NAND cell units, each of which has a plurality of electrically rewritable and non-volatile memory cells connected in series so that unit cell area thereof is smaller than NOR-type one, and it is easy to achieve a large capacitance. Further, data read and write being performed page by page, a high-speed performance will be achieved.

To miniaturize the NAND-type flash memory further, it will be required to miniaturize the device isolation area. However, the miniaturization of the device isolation area reads to reduction of the breakdown voltage between cells. To achieve the cell's miniaturization without the above-described breakdown voltage reduction, it is effective that the memory cell array with NAND cell units is formed on an SOI (Silicon On Insulator) substrate (for example, see Unexamined Japanese Patent Application Publication No. 2000-174241).

In a NAND-type flash memory formed of an SOI substrate, there is a fear of that carriers remained in the NAND cell channel after data write or read operation read to deterioration of the data reliability. The reason will be explained in detail below. NAND cell channel bodies are formed on an SOI substrate not only to be separated independently of each other but also to have an extremely small capacitance each, as different from a bulk-type flash memory with a memory cell array formed on a common p-type well. Further, there is usually prepared select gate transistors disposed at the both ends of the NAND cell unit.

In case the select gate transistors become off before resetting the word line drive voltages after data write or read, the channel of the NAND cell unit (i.e., NAND cell channel) is not reset, so that a carrier remained state will be generated. This is such a state that electron injection into an erased cell's floating gate (i.e., electrons thereof have been discharged) easily occurs, and becomes a cause for erratic data write and the like.

SUMMARY OF THE INVENTION

According to an aspect of the present invention, there is provided a semiconductor device including:
a semiconductor layer provided on an insulating substrate or an insulating layer;
active areas each defined in the semiconductor layer with a device insulating film buried therein; and
NAND cell units formed on the active areas, each NAND cell unit including a plurality of electrically rewritable and non-volatile memory cells connected in series, both ends of each NAND cell unit being coupled to a source line and a bit line, wherein
the device has such a carrier discharging mode as to discharge channel carriers in the NAND cell unit to at least one of the source line and the bit line.

According to another aspect of the present invention, there is provided a semiconductor memory device including:
a semiconductor layer provided on an insulating substrate or an insulating layer;
active areas each defined in the semiconductor layer with a device insulating film buried therein; and
NAND cell units formed on the active areas, each NAND cell unit including a plurality of electrically rewritable and non-volatile memory cells connected in series;
word lines each formed to coupling control gates of the memory cells arranged in one direction in common;
bit lines formed to be coupled to one ends of the NAND cell units via first select gate transistors; and
a source line formed to be coupled to the other ends of the NAND cell units via second select gate transistors, wherein
a carrier discharging operation is performed to discharge channel carriers in the NAND cell unit to at least one of the source line and the bit lines.

DETAILED DESCRIPTION OF THE EMBODIMENTS

Illustrative embodiments of this invention will be explained with reference to the accompanying drawings below.

Figure 1:
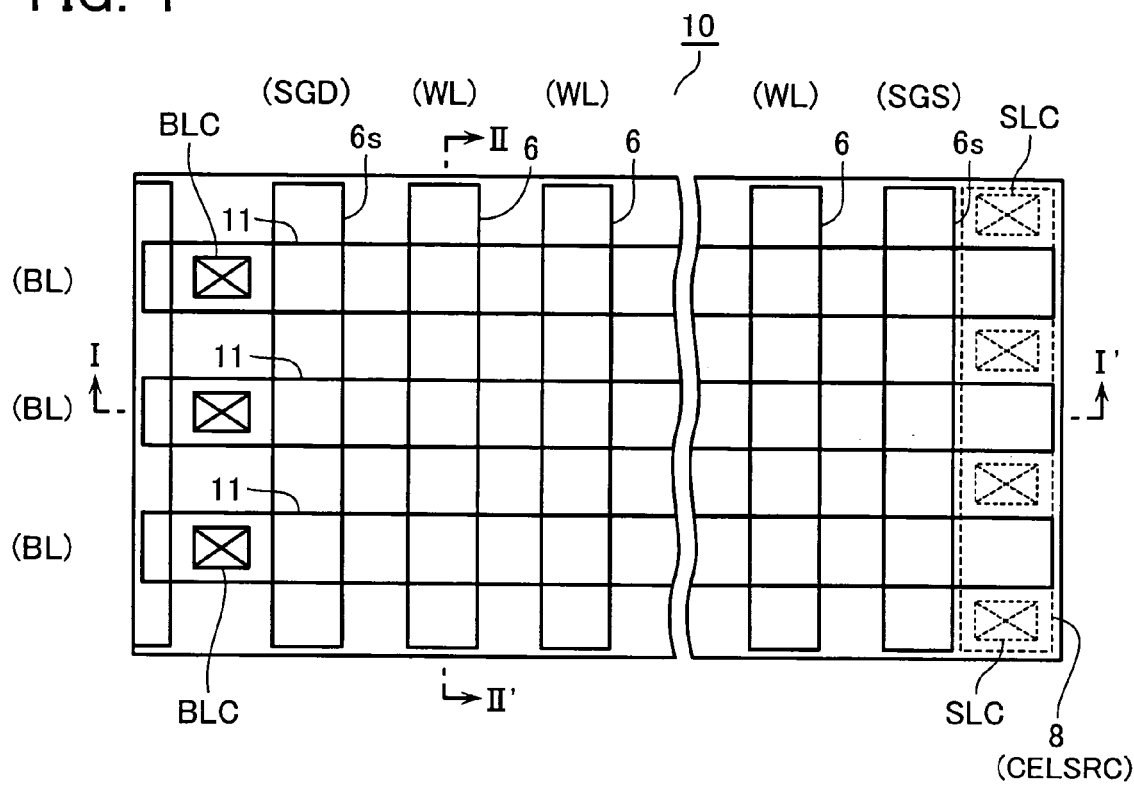
FIG. 1 shows a plan view of the memory cell array in a flash memory in accordance with an embodiment of the present invention.
Figure 2:
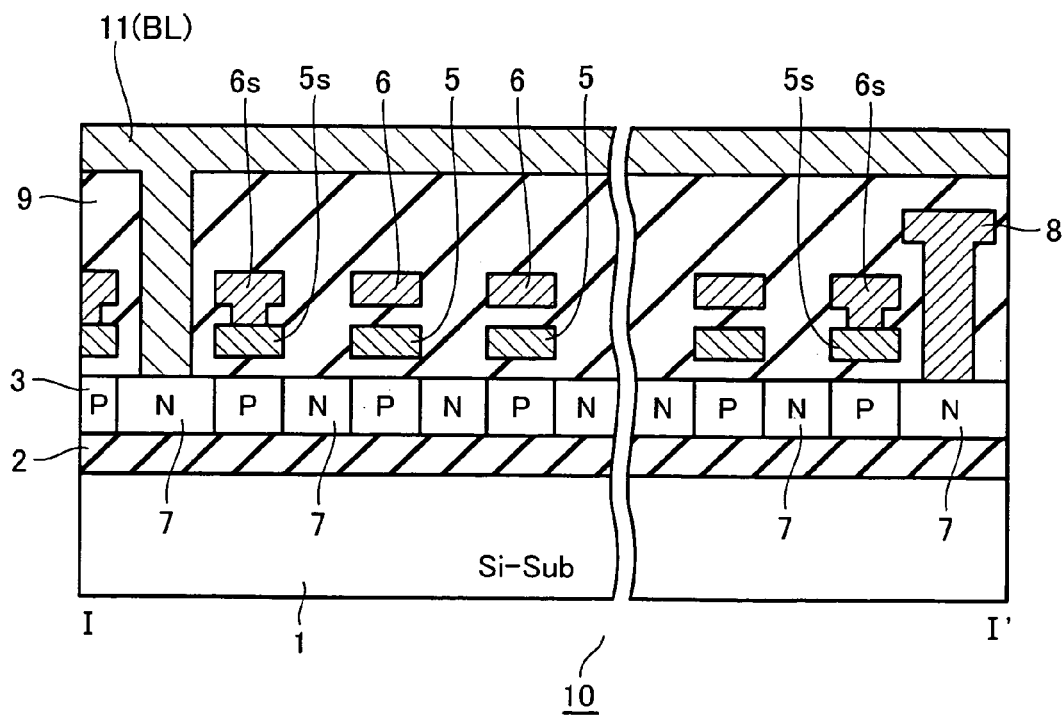
FIG. 2 shows I-I' sectional view of the memory cell array shown in FIG. 1.
Figure 3:
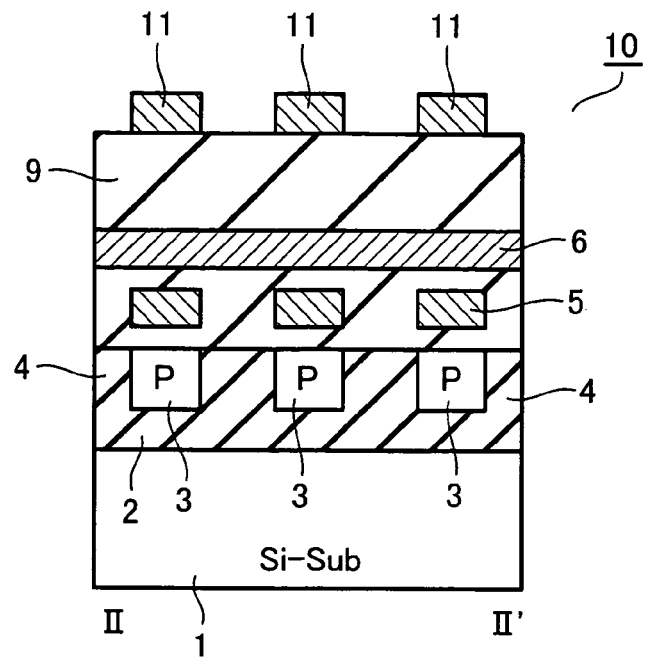
FIG. 3 shows II-II' sectional view of the memory cell array shown in FIG. 1.

FIG. 1 is a plan view of a memory cell array 10 in a NAND-type flash memory in accordance with an embodiment of the present invention, and FIGS. 2 and 3 are sectional views thereof taken along lines I-I' and II-II', respectively, in FIG. 1.

The memory cell array 10 is formed on an SOI (Silicon On Insulator) substrate, which has an insulating substrate (i.e., silicon substrate 1 covered with an insulating film 2 such as a silicon dioxide) and a p-type silicon layer 3 formed thereon. The silicon layer 3 is divided into a plurality of active areas (i.e., device forming areas) with a stripe type each, which are separated from each other in the width direction as defined by a device isolation film 4 buried in the silicon layer 3.

Floating gates 5 are formed on the silicon layer 3 with gate insulating films interposed therebetween; and control gates 6 on the floating gates 5 with gate-gate insulating films interposed therebetween. The control gates are patterned to be continuous in one direction and serve as word lines WL. N-type source and drain diffusion layers 7 are formed in the silicon layer as being self-aligned to the control gates 6. With the above-described structure, NAND cell units are formed, in each of which a plurality of memory cells with floating gate type each are connected in series, in such a manner that adjacent two cells share a source/drain diffusion layer.

Formed at the both ends of the NAND cell unit are select gate transistors, which have gate electrodes each integrally formed of gate electrode material films 5s and 6s corresponding to the floating gate 5 and control gate 6 in the memory cell, respectively.

The device substrate, on which the memory cells are formed, is covered with an interlayer insulating film 9, on which bit lines (BL) 11 are formed. Each bit line 11 is contacted with the drain diffusion layer 7 of one select gate transistor disposed on one side of the NAND cell unit at a bit line contact portion BLC. Buried in the interlayer insulating film 9 is a common source line (CELSRC) 8, which is contacted with the source layer 7 of the other select gate transistor disposed on the other side of the NAND cell unit at a source line contact portion SLC.

Figure 4:
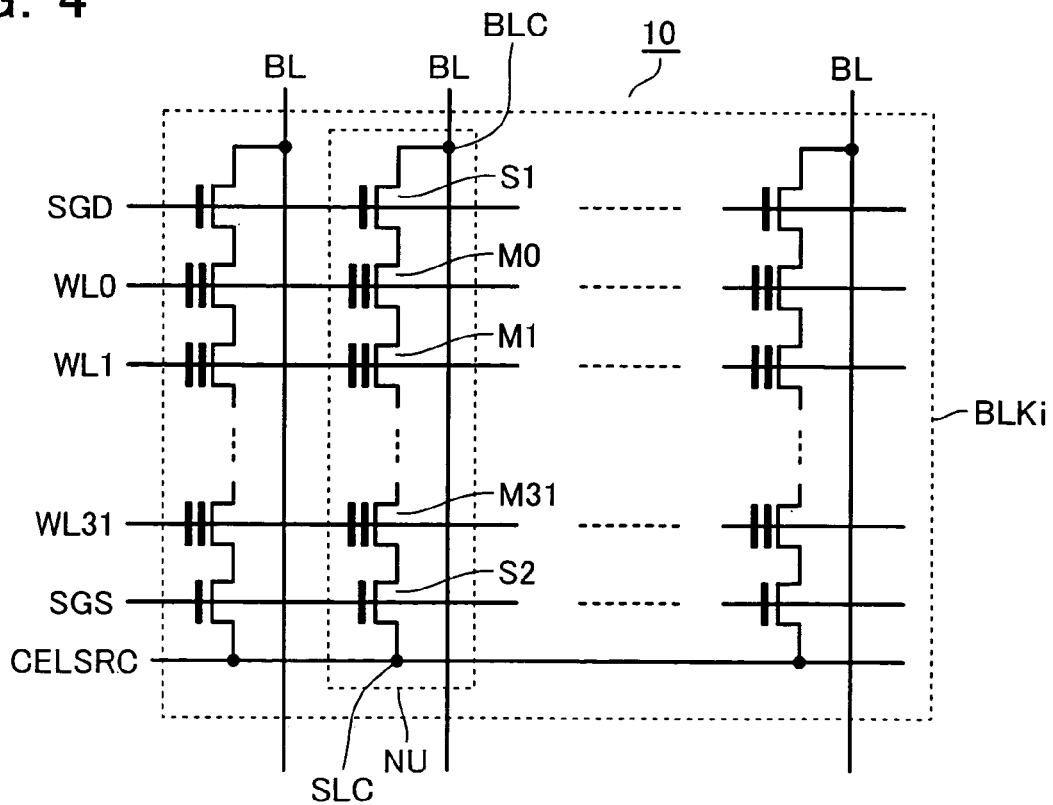
FIG. 4 shows an equivalent circuit of the memory cell array.

FIG. 4 shows an equivalent circuit of the memory cell array 10 formed as described above. As shown in FIG. 4, plural memory cells (thirty two cells in this example) are connected in series to constitute a NAND cell unit NU. The both ends of the NAND cell unit NU are coupled to a bit line BL and a common source line CELSRC via select gate transistors S1 and S2, respectively.

Control gates of memory cells M0-M31 are coupled to different word lines WL0-WL31, respectively. That is, a word line is formed to couple control gates of the memory cells arranged in one direction in common. Gates of select gate transistors S1 and S2 are coupled to select gate lines SGD and SGS, which are disposed in parallel with the word lines, respectively.

In case of binary data storage scheme, a set of memory cells arranged along a word line constitutes one page or two pages, and data read and write are performed page by page. In case of 4-value data storage scheme, the upper page data and the lower page data are written into a cell range corresponding one page in the binary data storage scheme.

A set of NAND cell units sharing a word line constitutes a block, which serves as an erase unit. Although only one block is shown in FIG. 4, plural blocks are usually arranged in the direction of the bit line BL.

Figure 5:
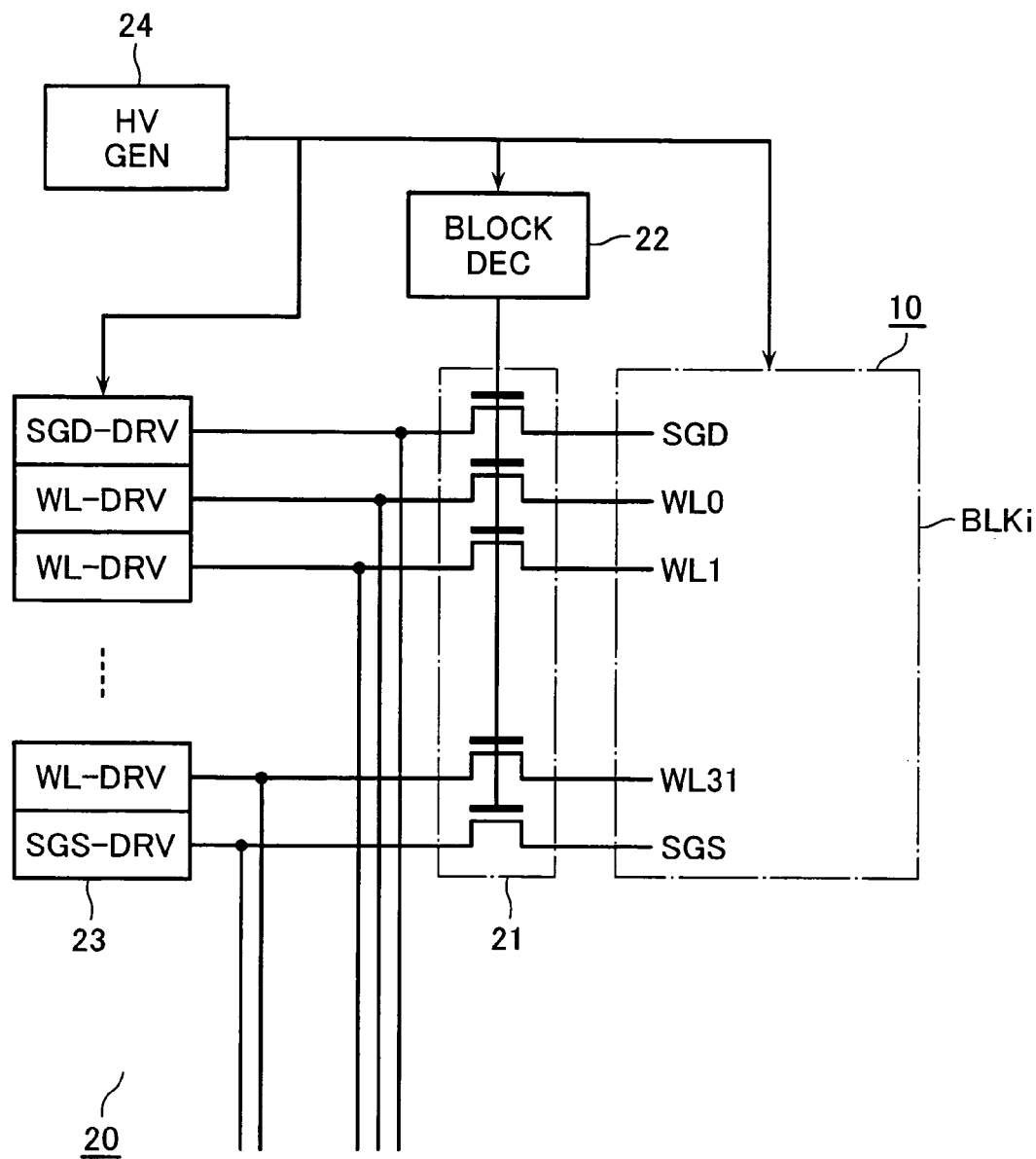
FIG. 5 shows the row decoder configuration of the flash memory.

FIG. 5 shows a configuration example of the row decoder 20, which selectively drive word lines and select gate lines in the memory cell array 10. Row decoder 20 includes a transistor array 21 for transferring word line and select gate line drive signals. To drive the transistor array 21, block decoder 22 is prepared. That is, the transistor array 21 becomes on only for a block, which the block decoder 22 selects.

Signal driver group 23 includes 32 word line drivers WL-DRV for driving word lines WL0-WL31 and select gate line drivers SGD-DRV, SGS-DRV for driving select gate lines SGD, SGS. This driver group 23 is disposed as shared by plural blocks, and drive signals thereof are supplied to only a selected block.

Note here that since it is required of the block decoder 22 and driver group 23 to be applied with high voltages boosted higher than the power supply voltage in accordance with operation modes, the output voltages of the high voltage generation circuit 24 are supplied to it.

Figure 6:
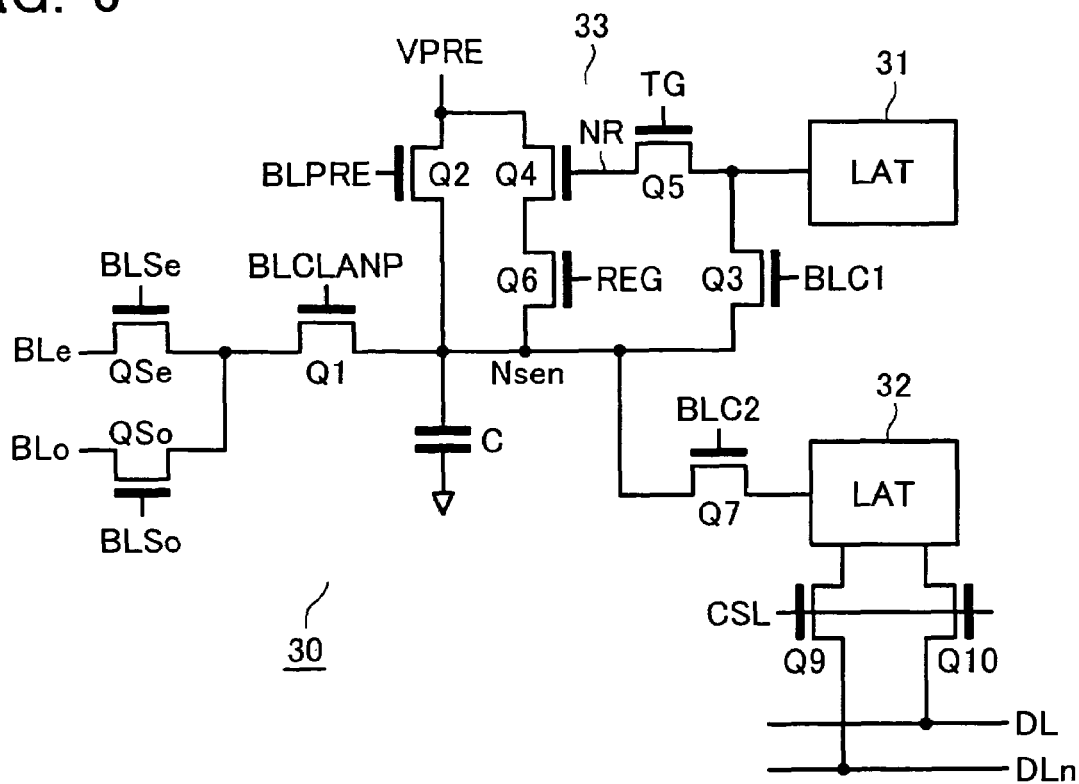
FIG. 6 shows the sense unit configuration of the flash memory.

FIG. 6 shows a sense amplifier unit 30, which is coupled to a bit line in the memory cell array 10. It is shown, in this example, such a case that sense amplifier unit 30 is shared by two adjacent bit lines, even numbered bit line BLe and odd numbered bit line BLo. That is, the sense unit 30 is coupled to either one of bit lines BLe and BLo via bit line select transistors QSe and QSo.

Disposed between a sense node Nsen and the bit line is a clamping transistor Q1, which serves for clamping and pre-sensing the bit line voltage. Further coupled to the sense node Nsen is a pracharging transistor Q2 for precharging the bit line and the sense node.

Sense node Nsen is coupled to a first data latch 31 via a transferring transistor Q3. This data latch 31 serves for storing read data and write data. Further, the sense node Nsen is coupled to a second data latch 32, which serves as a data cache, via a transferring transistor Q7. This data latch 32 is coupled to data lines DLn, DL via column select transistors Q9, Q10, and coupled to external input/output nodes via a dada buffer (not shown).

A data storage circuit 33 is prepared for temporarily holding the write data stored in the data latch 31 at a data write mode. Data write is performed by repeat of a write voltage application and a write-verify operation for verifying the write state. In this write sequence, it is in need of determining the write data in the data latch 31 for each write cycle in accordance with the verify-read result. For this purpose, the data storage circuit 33 is used.

Gate NR of transistor Q4 serves as a data storage node, to which data of the data latch 31 is transferred via a transferring transistor Q5. Data in the data latch 31 is transferred to and temporarily held at the storage node NR. Between the transistor Q4 and the sense node Nsen, write-back transistor Q6 is disposed. Write data of each write cycle is written back to the data latch 31 via sense node Nsen in accordance with data at the storage node NR.

Next, the operation of the NAND-type flash memory will be explained below.

Data write is performed with "0" write, which is for changing the memory cell's threshold voltage to the positive direction, and "1" write (i.e., write inhibiting) for keeping the memory cell's threshold as it is without changing it. This basic operation is the same in both of binary data and 4-value data storage schemes.

To do the above described data write, write data "0" (="L") or "1"(="H") is loaded in data latch 31. In accordance with this write data, selected NAND cell channels will be controlled in potential via the corresponding bit lines. And then, a selected word line being applied with write voltage Vpgm, electron injection occurs from the NAND cell channel to the floating gate in a "0" write cell while such the electron injection does not occur in a "1" write cell.

Figure 7:
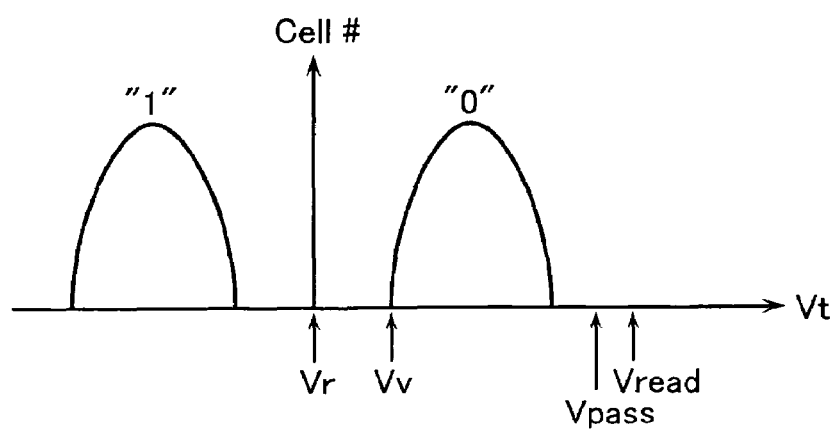
FIG. 7 shows the data threshold distributions of the flash memory.

As shown in FIG. 7, in case of binary data storage scheme, as a result of the above-described data write operation, data "1" (erase state) distribution with a negative threshold voltage and data "0" distribution with a positive threshold voltage may be obtained.

After the write voltage application, write-verify will be performed. In this write-verify, data latch 31 is written back in such a way that "0" write being verified, the following cycle becomes "1" write (write inhibit) while "0" write being verified as insufficient, "0" write is performed again.

As described above, write data in the data latches 31 in one page will be controlled in such a manner that the entire "0" write bits being completely written, an all "1" state is obtained. Although not shown in FIG. 6, a verify-judge circuit will be prepared to detect the all "1" state and judge the write completion (verify-"Pass").

In a data read mode, as shown in FIG. 7, read voltage Vr (e.g., 0V) is applied to a selected word line; and read pass voltage Vread, which makes cells on without regard to cell data thereof, to non-selected word lines. With these voltages, it is detected whether cell current flows or not based on the selected cells. In detail, the selected bit line is precharged to a certain potential prior to data sensing. Detect whether the selected bit line is discharged or not, and data will be sensed.

In this embodiment, it is impossible to erase a block in a lump as different from the conventional bulk-type flash memory, in which the memory cell array is formed on a p-type well. Therefore, data erase will be performed in order of the word lines, for example, as sequential from the word line disposed at the bit line contact portion BLC side.

Figure 15:
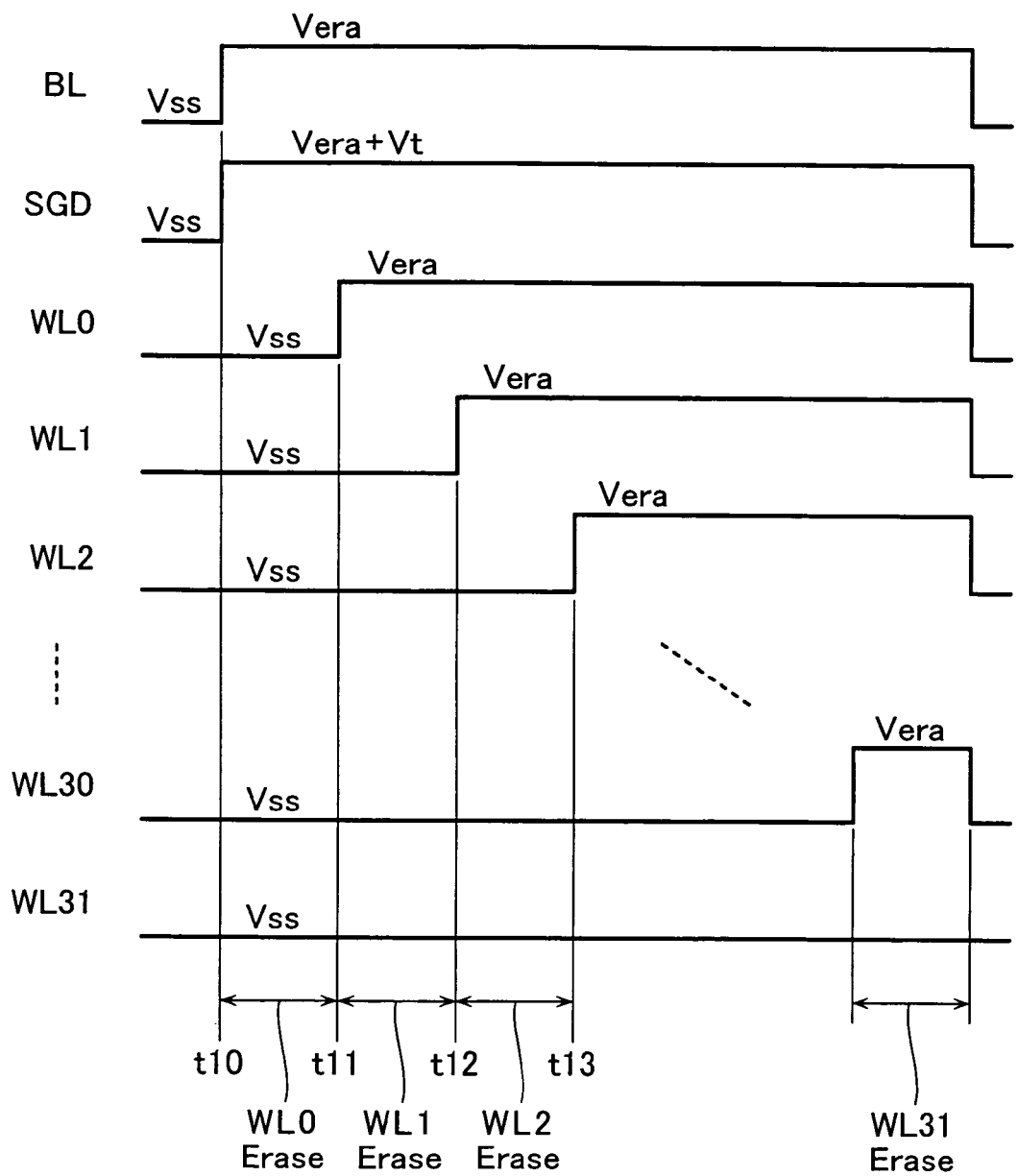
FIG. 15 shows a timing diagram for explaining an erase operation of the flash memory.

A data erase example will be explained in detail below with reference to FIG. 15. Erase voltage Vera is applied to bit line BL at timing t10; and at the same time, voltage Vera+Vt (Vt: threshold voltage of the select gate transistors) to the select gate line SGD at the bit line side. At this time, the entire word lines WL0-WL31 in a selected block are kept Vss.

With this voltage application, erase voltage Vera applied to the bit line is transferred to the drains of memory cells along the word line WL0. Therefore, in the memory cells disposed along the word line WL0, electrons in these floating gates are discharged, so that data are erased.

Following it erase voltage Vera being applied to the word line WL0 at timing t11, erase voltage Vera at the bit line is transferred to the drains of memory cells along the word line WL1. As a result, in the memory cells disposed along the word line WL1, electrons in these floating gates are discharged, so that data are erased. Note here that if erased cell's threshold voltage is negative, the word line voltage can be set lower than the erase voltage Vera.

Sequentially raise up the word lines as described above, and data erase may be performed word line by word line.

In the above-referred Unexamined Japanese Patent Application Publication No. 2000-174241, to perform data erase by a block in the NAND-type flash memory with an SOI structure, it has been provided such a technique that a MOS gate is formed on the back surface of the memory cell array, thereby making possible apply erase voltage to the NAND cell channels in a lump.

In this embodiment, to avoid such a situation that unnecessary carriers are remained in the NAND cell channel, a "carrier discharging mode" is set as following the above-described data read and write operations for discharging the channel carriers remained in the NAND cell unit.

Figure 8:
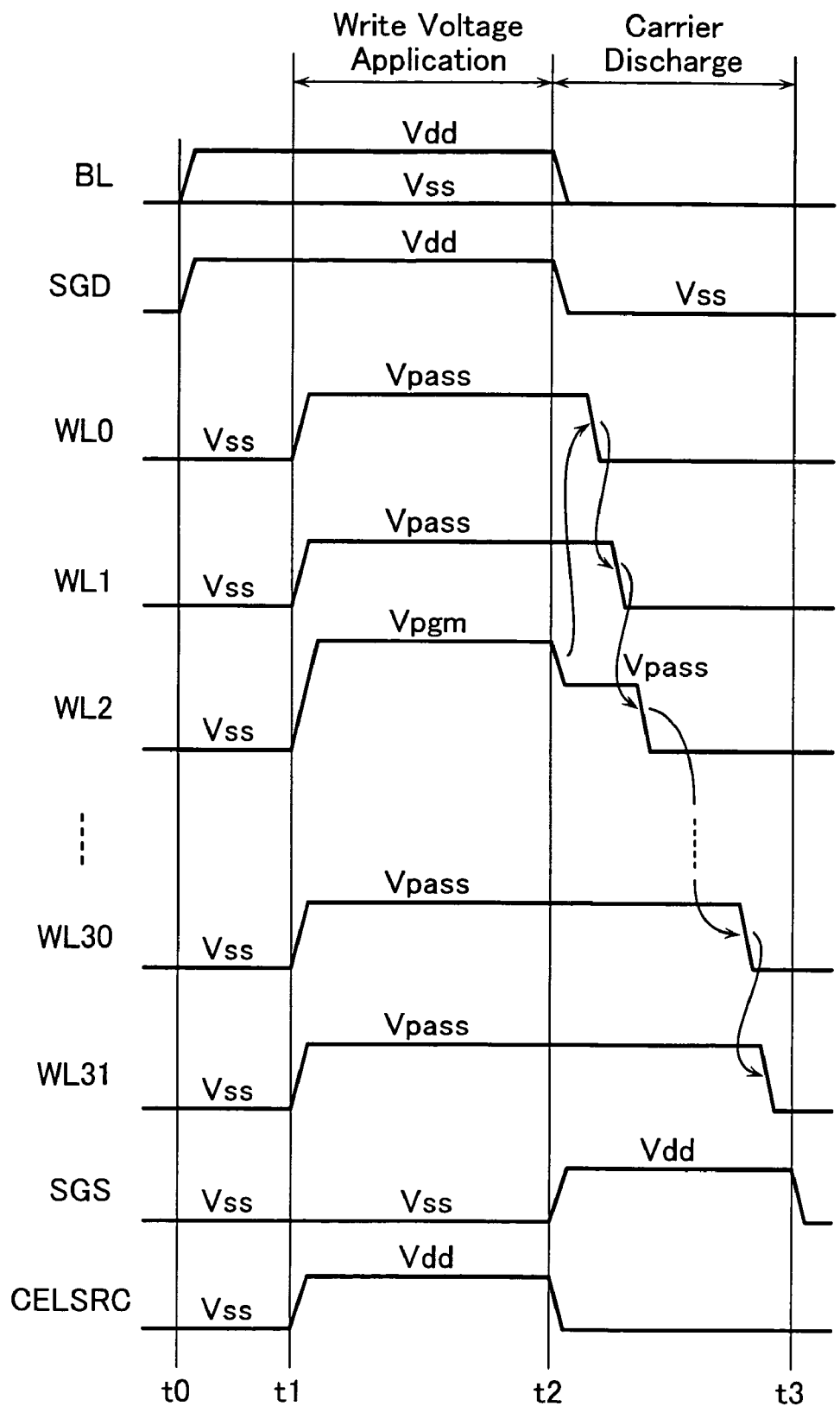
FIG. 8 shows a timing diagram for explaining a write operation and the successive carrier discharging operation of the flash memory.

FIG. 8 shows an example, in which a carrier discharging mode is set as following the write voltage application operation for discharging the carriers in the NAND cell channel to the common source line CELSRC. Vdd or Vss is applied to a selected bit line in accordance with write data "0" or "1" at timing t0; and at the same time, Vdd is applied to the select gate line SGD, thereby turning on the bit line side select gate transistor.

At timing t1, write voltage Vpgm is applied to a selected word line WL2; and write pass voltage Vpass to non-selected word lines. The write pass voltage Vpass is a medium voltage necessary for turning on cells without regard to cell data and boosting the channel of non-selected cells to such a potential level that data write does not occur. At this time, the select gate line SGS on the common source line CELSRC side is applied with Vss so that the select gate transistor S2 is kept off. To prevent this select gate transistor S2 from being punched-through, Vdd is applied to the common source line CELSRC. As a result, data write is performed in the memory cells disposed along the selected word line WL2.

After the above-described write voltage application, a carrier discharging operation will be performed as follows. At timing t2, apply Vss to the selected bit line BL; apply Vss to the select gate line SGD, thereby turning off the select gate transistor S1; step down the selected word line WL2 to the write pass voltage Vpass from the write voltage Vpgm; and apply Vdd to the select gate line SGS on the common source line CELSRC, thereby turning on the select gate transistor S2.

With the above-described voltage application; such a situation is obtained that the entire memory cells in the NAND cell unit are turned on. Following it, as shown by arrows, the word line WL0 disposed the nearest to the bit line contact BLC is reset to be Vss, and successively the second word line WL1 is reset to be Vss. As similar to the above-description, the word lines are sequentially reset. As a result, the memory cells in the NAND cell unit are sequentially turned off from one near the bit line contact BLC, so that carriers in the NAND cell channel are carried from the bit line contact BLC side to the common source line contact SLC, and discharged to the common source line CELSRC.

The select gate line SGS being reset to be Vss after the entire word lines WL0-WL31 have been sequentially reset in potential, the carrier discharging operation ends (timing t3).

Figure 11:
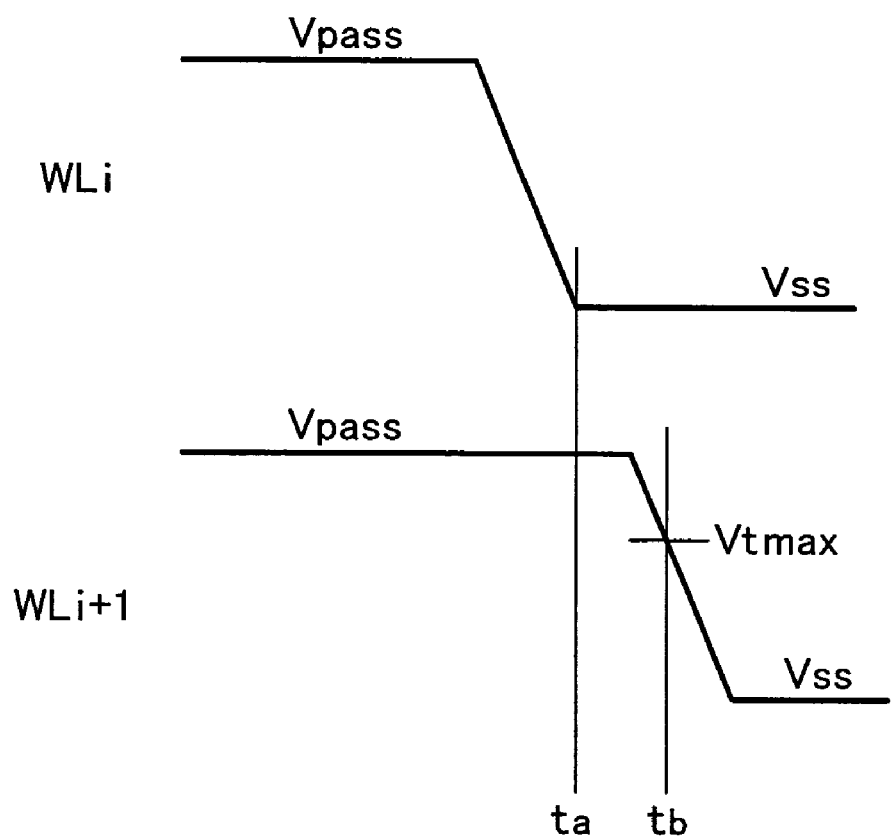
FIG. 11 shows a driving method of adjacent word lines used in the carrier discharging mode.

Here, the condition of the above-described sequential word line level reset will be explained below with reference to FIG. 11. FIG. 11 shows such a case that adjacent word lines WLi and WLi+1 are sequentially reset to be Vss from Vpass in this order. Supposing that the word line WLi becomes Vss at timing "ta", the timing "tb", at when the word line WLi+1 becomes the maximum cell's threshold voltage Vtmax, is made late to the timing "ta".

In other words, at timing "ta", at when the memory cell Mi driven by the word line WLi becomes off, the memory cell Mi+1 driven by the word line WLi+1 is kept on without regard to cell data. With this word line driving method, the memory cells' carriers are carried from the bit line contact side as being squeezed in one direction without remained carries.

According to this embodiment, while the device is formed on the SOI substrate, there are no carriers remained in the NAND cell channel after the data write operation. Therefore, it may be avoided such a situation that the remained carriers disturb the device data, and data stability and reliability will be improved.

Note here that the adjacent word line driving condition explained with reference to FIG. 11 is effective in other carrier discharging modes described later.

Figure 9:
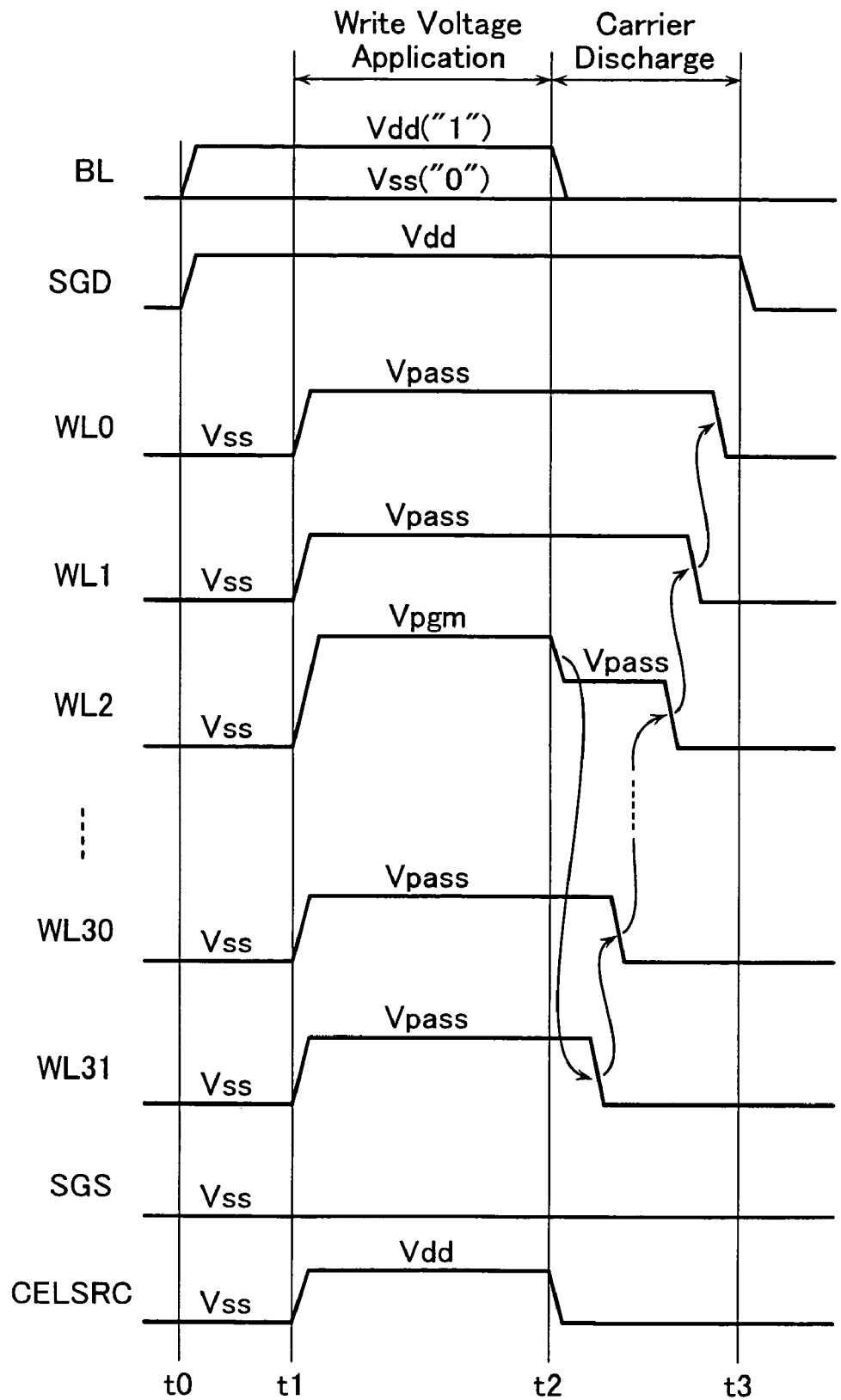
FIG. 9 shows another timing diagram for explaining a write operation and the successive carrier discharging operation of the flash memory.

FIG. 9 shows another example, in which a carrier discharging mode is set as following the write voltage application operation for discharging the carriers in the NAND cell channel to the bit line BL.

The data write operation from timing t0 to timing t2 is the same as that shown in FIG. 8. After having finished the word line voltage application, the bit line BL and common source line CELSRC are reset to be Vss; and the selected word line WL2 is stepped down to the write pass voltage Vpass from the write voltage Vpgm (timing t2). These also are the same as in FIG. 8.

While the select gate lines SGD and SGS are kept as applied with Vdd and Vss, respectively, as shown by arrows, the word line WL31 disposed the nearest to the common source line CELSRC is reset to be Vss from Vpass, and successively the second word line WL30 is reset to be Vss. As similar to the above-description, the word lines are sequentially reduced in potential. As a result, the memory cells in the NAND cell unit are sequentially turned off from one near the common source line contact SLC, so that carriers in the NAND cell channel are carried from the common source line contact SLC side to the bit line contact BLC, and discharged to the bit line BL.

The select gate line SGS being reset to be Vss after the entire word lines WL0-WL31 have been sequentially reset in potential, the carrier discharging operation ends (timing t3). As a result, data after writing may be improved in reliability.

Figure 10:
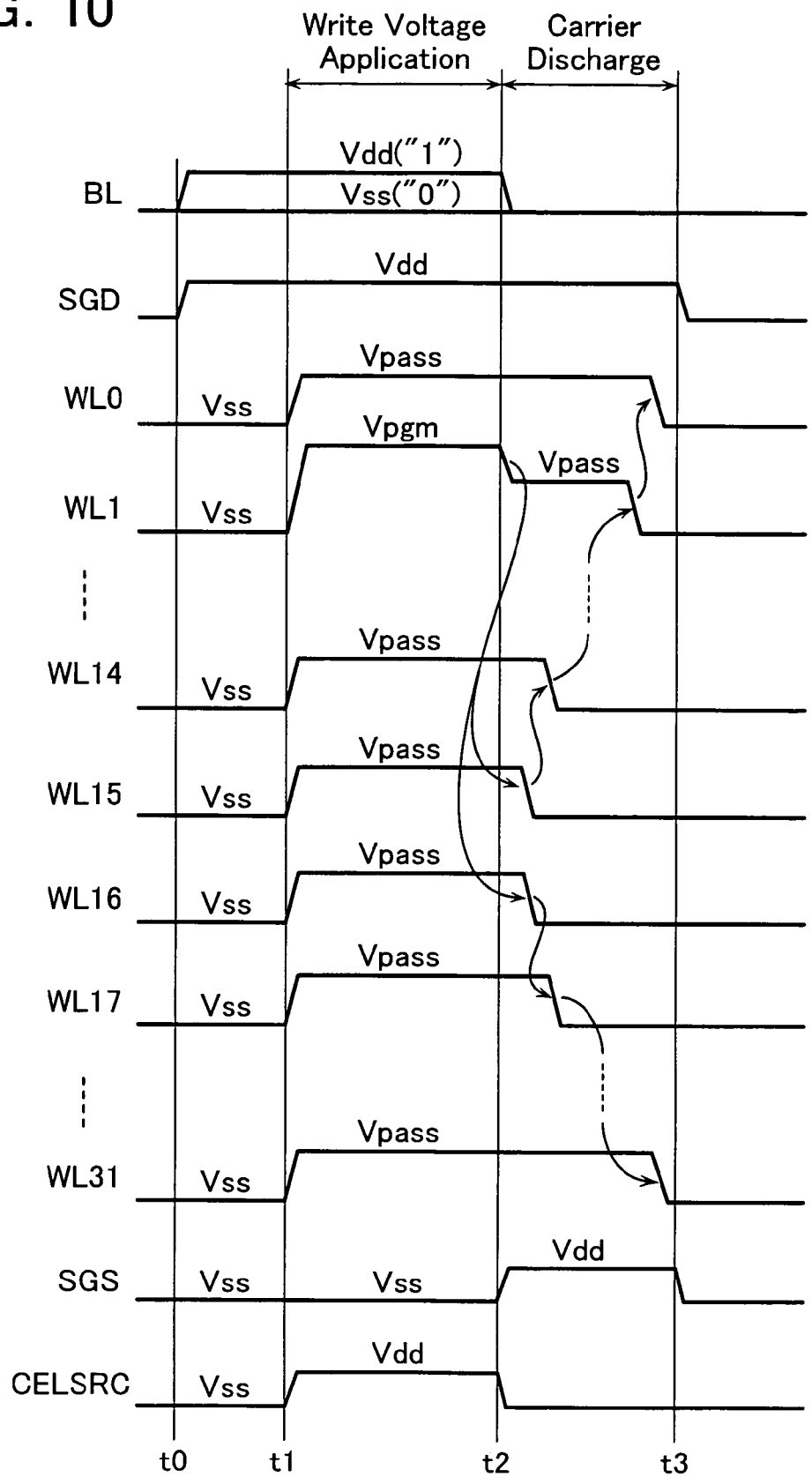
FIG. 10 shows still another timing diagram for explaining a write operation and the successive carrier discharging operation of the flash memory.

FIG. 10 shows still another example, in which a carrier discharging mode is set as following the write voltage application operation for discharging the carriers in the NAND cell channel to the both of bit line BL and source line CELSRC simultaneously.

The data write operation from timing t0 to timing t2 is the same as that shown in FIGS. 8 and 9. After having finished the word line voltage application, the bit line BL and common source line CELSRC are reset to be Vss; and the selected word line WL1 is stepped down to the write pass voltage Vpass from the write voltage Vpgm (timing t2). These also are the same as in FIGS. 8 and 9.

In the carrier discharging mode, apply Vdd to the select gate line SGS, and both of the select gate transistors S1 and S2 are kept on. As shown by arrows, two word lines WL15 and WL16, which are disposed midway in the NAND cell unit (i.e., disposed at the central position in the NAND cell unit or near it), are reset to be Vss from Vpass, and following it two word lines WL14 and WL17 disposed adjacent to WL15 and WL16, respectively, are reset to be Vss. Similarly, the remaining word lines are sequentially reduced in potential two by two.

As a result, the memory cells in the NAND cell unit are sequentially turned off from the central portion in the NAND cell unit, so that carriers in the NAND cell channel are carried from the central portion to the source line CELSRC and the bit line BL simultaneously.

The select gate lines SGS and SGD being set to be Vss after the entire word lines WL0-WL31 have been sequentially reduced in potential, the carrier discharging operation ends (timing t3). As a result, data after the writing operation may be improved in reliability like the examples shown in FIGS. 8 and 9.

Figure 12:
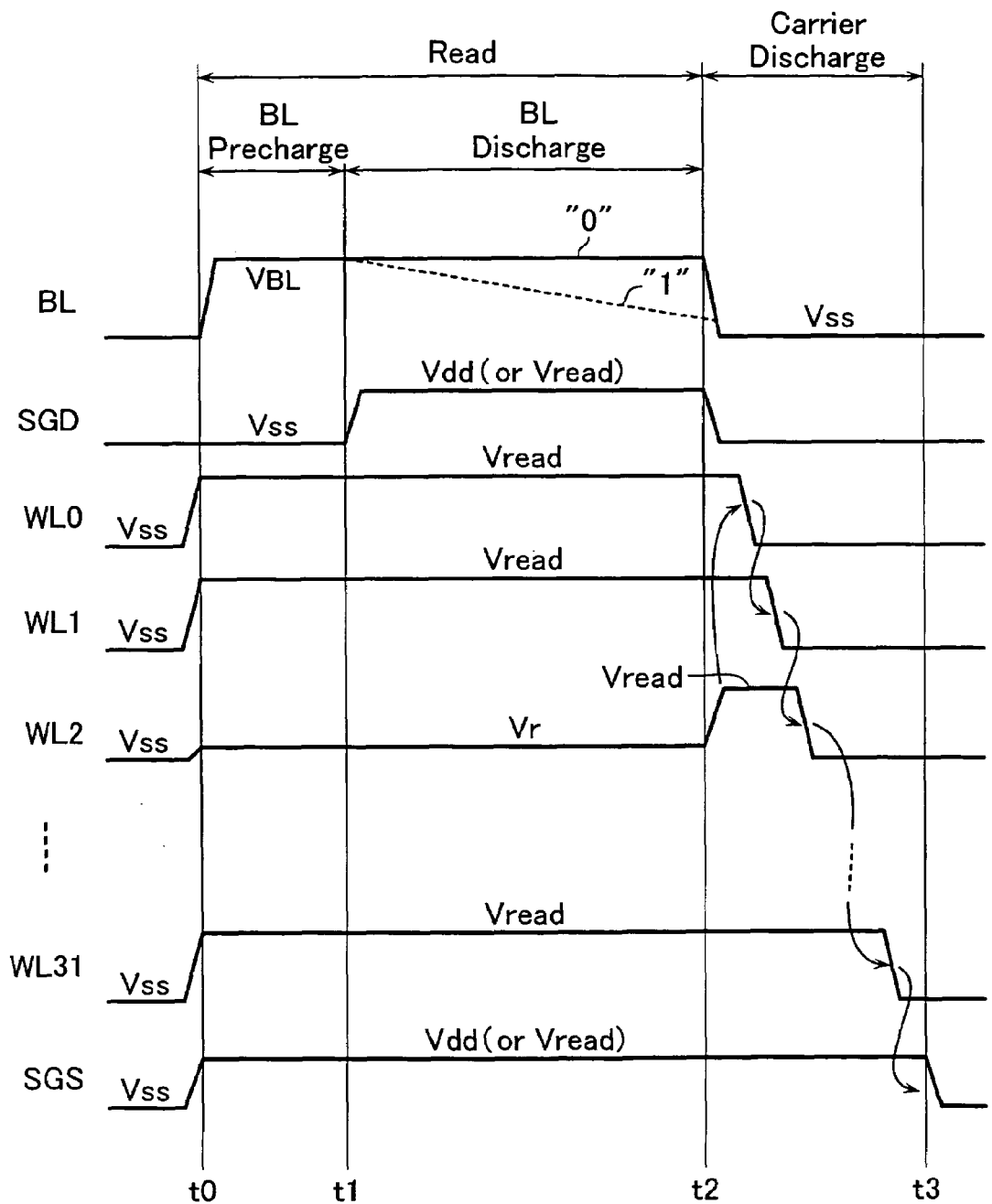
FIG. 12 shows a timing diagram for explaining a read operation and the successive carrier discharging operation of the flash memory.

FIG. 12 shows an example, in which a carrier discharging mode is set as following a read operation for discharging the carriers in the NAND cell channel to the common source line CELSRC.

In a data read mode, initially the clamping transistor Q1 and the precharging transistor Q2 are turned on, and a selected bit line BL is precharged to VBL (timing t0-t1). Prior to the beginning of the bit line precharge (or thereafter), apply the read voltage Vr to a selected word line WL2; apply the read pass voltage Vread to non-selected word lines, which turns on cells without regard to cell data; and apply Vdd (or Vread) to the select gate line SGS. While the bit line precharge is performed, the select gate line SGD on the bit line side is set to be Vss.

After the bit line precharge, apply Vdd to the select gate line SGD at timing t1, thereby turning on the select gate transistor S1. As a result, the bit line BL will be discharged in accordance with the selected cell's data. That is, in case of a binary data storage scheme, cell data "1" makes the bit line BL be discharged while cell data "0" makes the bit line BL be remained as it is. Therefore, detect the bit line discharge state after a certain period, and data may be read out.

In case of the binary data storage scheme, the read voltage Vr and read pass voltage Vread are shown in FIG. 7. By contrast, in case of 4-value data storage scheme, plural read operations should be performed with different read voltages because it is in need of distinguishing between four threshold distributions.

The carrier discharging mode is set in the period from timing t2 to timing t3 just after the data read operation. At timing t2, the bit line BL and the select gate line SGD are reset to Vss; and at the same time, the selected word line WL2 is boosted to Vread. As a result, such a state is obtained that the entire cells in the NAND cell units are turned on.

Then, as shown by arrows, the word line WL0 disposed the nearest to the bit line contact BLC is reset to be Vss, and following it the second word line WL1 is reset to be Vss. Similarly, the remaining word lines are sequentially reduced in potential. As a result, the memory cells in the NAND cell unit are sequentially turned off from one near the bit line contact BLC, so that carriers in the NAND cell channel are carried from the bit line contact BLC side to the common source line contact SLC, and discharged to the common source line CELSRC.

The select gate line SGS being reset to be Vss after the entire word lines WL0-WL31 have been sequentially reduced in potential, the carrier discharging operation ends (timing t3).

With the above-described carrier discharging operation, no carriers are remained in the NAND cell channel after the data read, and this prevents cell data from being destroyed.

Figure 13:
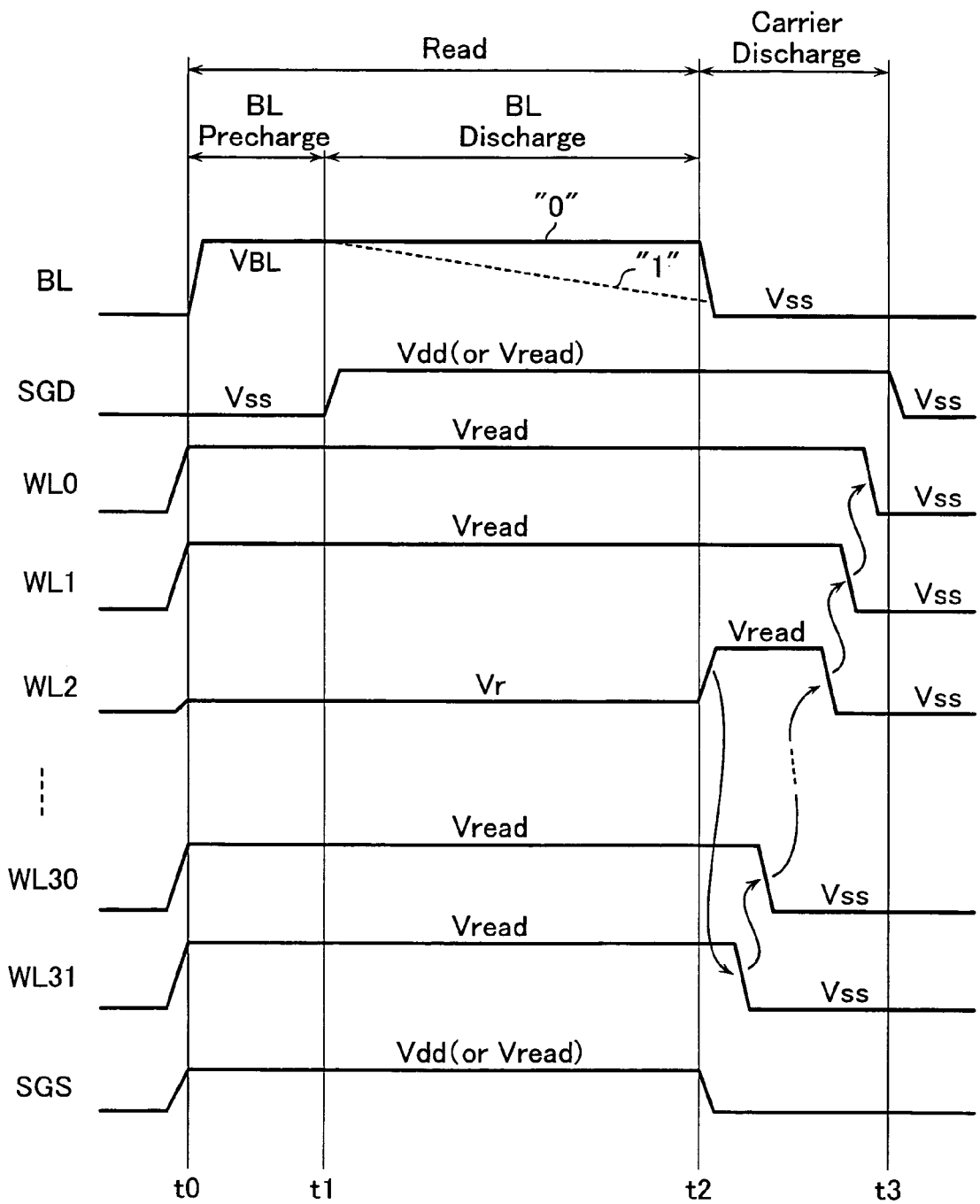
FIG. 13 shows another timing diagram for explaining a read operation and the successive carrier discharging operation of the flash memory.

FIG. 13 shows another example, in which a carrier discharging mode is set as following the read operation for discharging the carriers in the NAND cell channel to the bit line BL.

The read operation being the same as that shown in FIG. 12, explanation thereof will be omitted here. After the read operation, at timing t2, set the bit line BL and the select gate line SGS to be Vss; and at the same time, boost the selected word line WL2 to Vread. As a result, such a state is obtained that the entire cells in the NAND cell units are turned on.

Then, as shown by arrows, the word line disposed the nearest to the source line contact SLC is reset to Vss from Vread, following it the second word line WL30 is reset to Vss.

Similarly, the word lines are sequentially reset to turn off the memory cells in the NAND cell unit, so that carriers in the NAND cell channel are discharged to the bit line BL.

The select gate line SGD being reset to be Vss after the entire word lines WL31-WL0 have been sequentially reduced in potential, the carrier discharging operation ends (timing t3). With the above-described carrier discharging operation, data reliability may be improved as similar to the example shown in FIG. 12.

Figure 14:
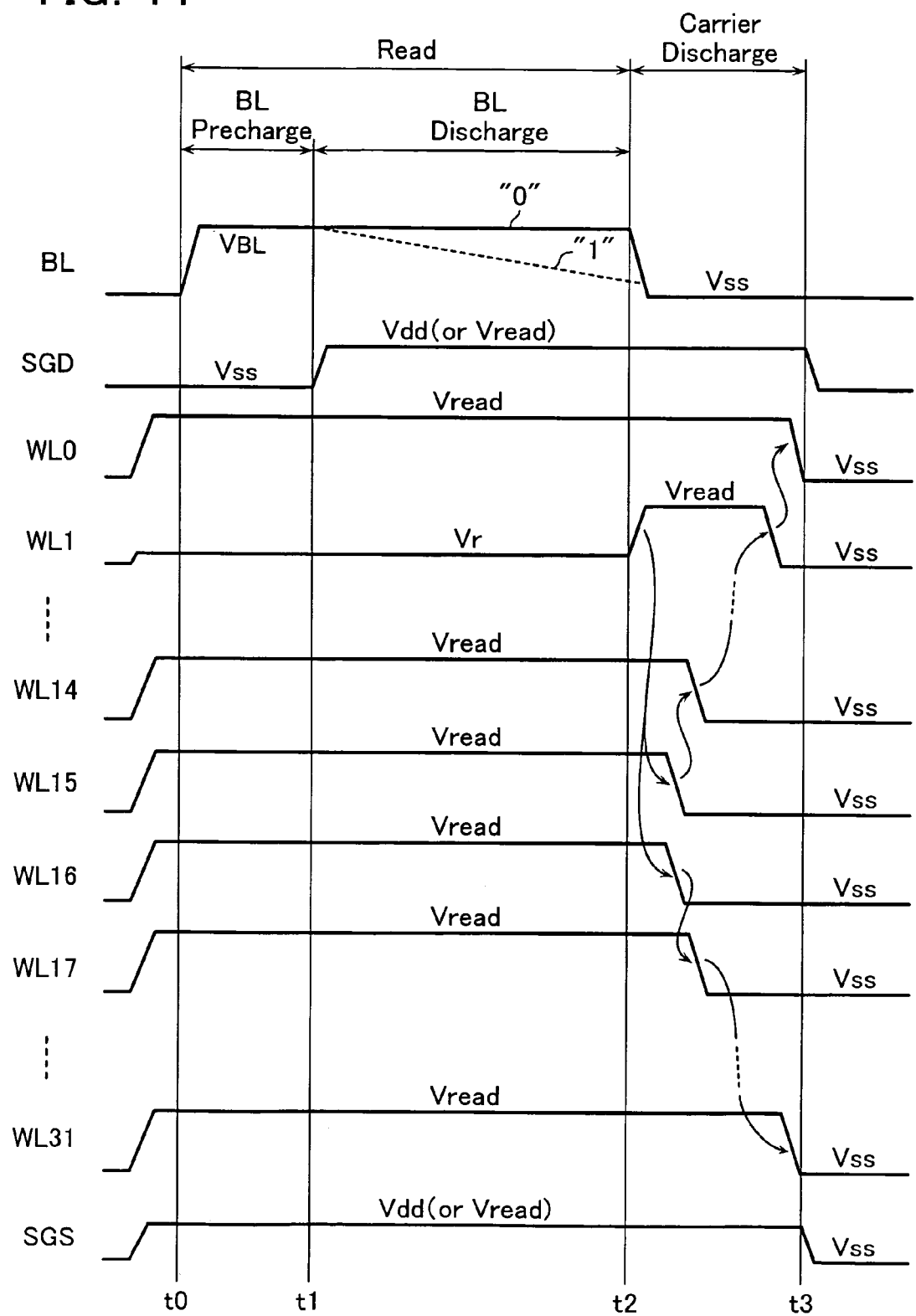
FIG. 14 shows still another timing diagram for explaining a read operation and the successive carrier discharging operation of the flash memory.

FIG. 14 shows still another example, in which a carrier discharging mode is set as following the read operation for discharging the carriers in the NAND cell channel to both of the bit line BL and the source line CELSRC.

The read operation being the same as that shown in FIG. 12, explanation thereof will be omitted here. After the read operation, at timing t2, set the bit line BL to be Vss; and at the same time, boost the selected word line WL1 to Vread. As a result, such a state is obtained that the entire cells in the NAND cell units are turned on. The select gate lines SGD and SGS are kept at Vdd (or Vread), thereby keeping the select gate transistors S1 and S2 on.

Then, as shown by arrows, two word lines WL15 and WL16, which are disposed midway in the NAND cell unit, ate reset to be Vss from Vread, and following it two word lines WL14 and WL17 disposed adjacent to WL15 and WL16, respectively, are reset to be Vss. Similarly, the remaining word lines are sequentially reduced in potential two by two.

As a result, the memory cells in the NAND cell unit are sequentially turned off from the central portion in the NAND cell unit, so that carriers in the NAND cell channel are carried from the central portion to the source line CELSRC and the bit line BL simultaneously.

The select gate lines SGS and SGD being reset to be Vss after the entire word lines WL0-WL31 have been sequentially reduced in potential, the carrier discharging operation ends (timing t3). As a result, data reliability may be improved like the examples shown in FIGS. 12 and 13.

Note here that the read operations explained with reference to FIGS. 12 to 14 include not only normal read operations but also verify-read operations performed for verifying the write states in a write sequence. The verify-read mode is the same as the normal read mode except that verify voltage corresponding to the lower limit of the threshold distribution to be verified is used as the read voltage Vr. For example, in the binary data storage scheme shown in FIG. 7, it will be used verify voltage Vv, which corresponds to the lower limit of the "0" data threshold distribution.

This invention is not limited to the above-described embodiment. For example, while it has been explained such a case that the binary data storage scheme is used, it should be appreciated that this invention may be adapted to a multi-value data storage scheme. This invention is effective especially in case of the multi-value data storage scheme because it is required of this scheme to precisely control the threshold distribution.

Further, having explained as following data write or read in the above-described embodiment, the carrier discharging operation may be performed as a refresh operation, which is independent of data write or read.

Additionally, having explained for such a memory cell that has a floating gate as a charge storage layer in the embodiment, other types of memory cells, for example, with a silicon nitride film as a charge storage layer, may be used. Still further, it may be used such a structure that the floating gate 5 is not opposed to the upper surface of the silicon active layer 3 but opposed to the side surface thereof, or to both of the upper surface and the side surface.

As an embodiment, an electric card using the non-volatile semiconductor memory devices according to the above-described embodiments of the present invention and an electric device using the card will be described bellow.

Figure 16:
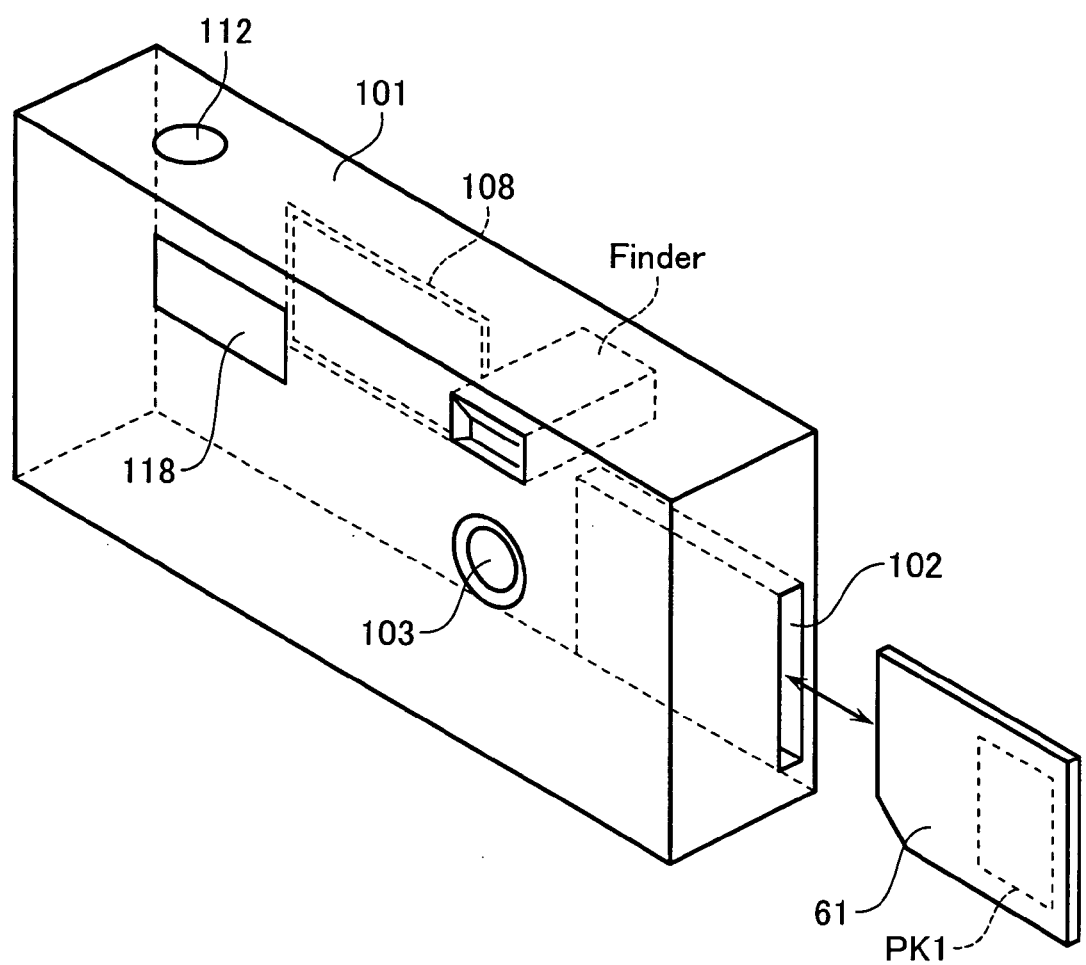
FIG. 16 shows another embodiment applied to a digital still camera.

FIG. 16 shows an electric card according to this embodiment and an arrangement of an electric device using this card. This electric device is a digital still camera 101 as an example of portable electric devices. The electric card is a memory card 61 used as a recording medium of the digital still camera 101. The memory card 61 incorporates an IC package PK1 in which the non-volatile semiconductor memory device or the memory system according to the above-described embodiments is integrated or encapsulated.

The case of the digital still camera 101 accommodates a card slot 102 and a circuit board (not shown) connected to this card slot 102. The memory card 61 is detachably inserted in the card slot 102 of the digital still camera 101. When inserted in the slot 102, the memory card 61 is electrically connected to electric circuits of the circuit board.

If this electric card is a non-contact type IC card, it is electrically connected to the electric circuits on the circuit board by radio signals when inserted in or approached to the card slot 102.

Figure 17:
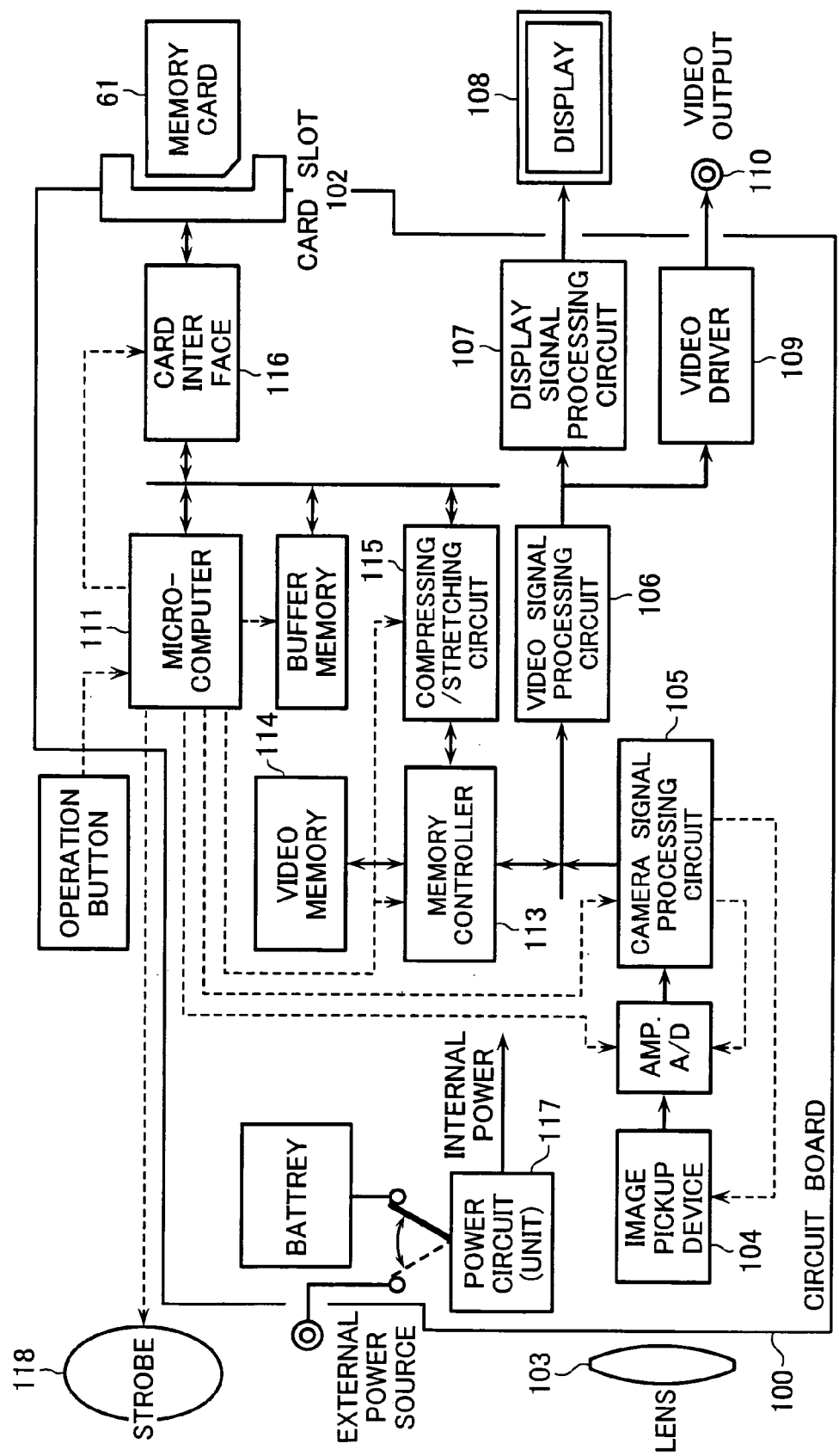
FIG. 17 shows the internal configuration of the digital still camera.
Figure 18A:
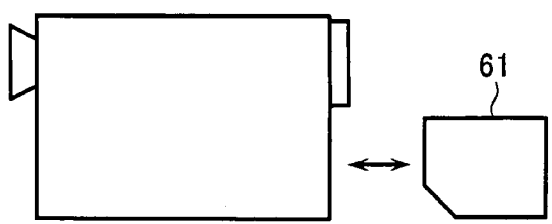
FIGS. 18A to 18J show other electric devices to which the embodiment is applied.
Figure 18F:
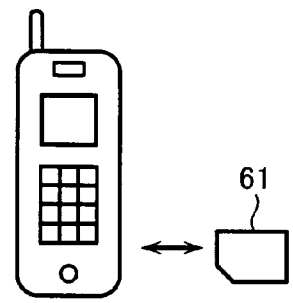
Figure 18B:
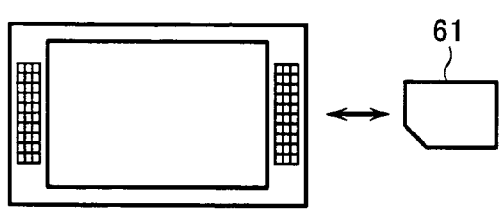
Figure 18G:
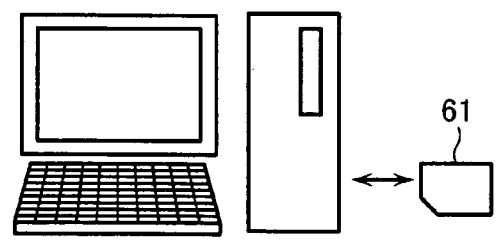
Figure 18C:
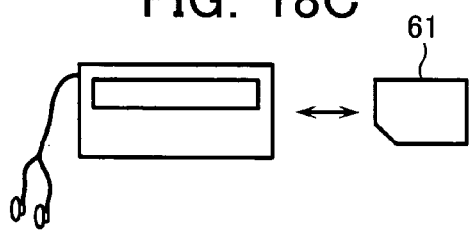
Figure 18H:
Figure 18D:
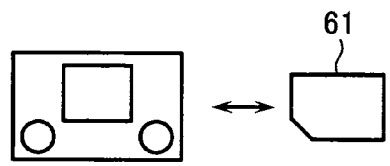
Figure 18I:
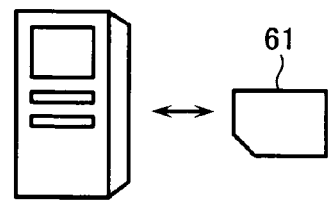
Figure 18E:
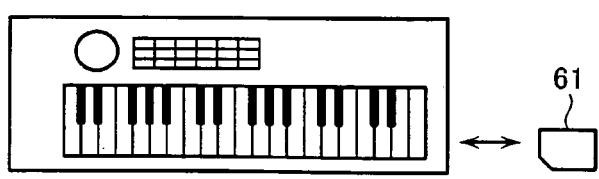
Figure 18J:
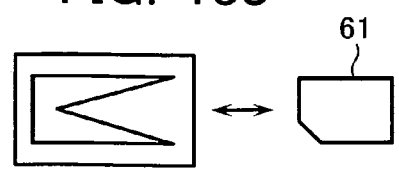

FIG. 17 shows a basic arrangement of the digital still camera. Light from an object is converged by a lens 103 and input to an image pickup device 104. The image pickup device 104 is, for example, a CMOS sensor and photoelectrically converts the input light to output, for example, an analog signal. This analog signal is amplified by an analog amplifier (AMP), and converted into a digital signal by an A/D converter (A/D). The converted signal is input to a camera signal processing circuit 105 where the signal is subjected to automatic exposure control (AE), automatic white balance control (AWB), color separation, and the like, and converted into a luminance signal and color difference signals.

To monitor the image, the output signal from the camera processing circuit 105 is input to a video signal processing circuit 106 and converted into a video signal. The system of the video signal is, e.g., NTSC (National Television System Committee). The video signal is input to a display 108 attached to the digital still camera 101 via a display signal processing circuit 107. The display 108 is, e.g., a liquid crystal monitor.

The video signal is supplied to a video output terminal 110 via a video driver 109. An image picked up by the digital still camera 101 can be output to an image apparatus such as a television set via the video output terminal 110. This allows the pickup image to be displayed on an image apparatus other than the display 108. A microcomputer 111 controls the image pickup device 104, analog amplifier (AMP), A/D converter (A/D), and camera signal processing circuit 105.

To capture an image, an operator presses an operation button such as a shutter button 112. In response to this, the microcomputer 111 controls a memory controller 113 to write the output signal from the camera signal processing circuit 105 into a video memory 114 as a flame image. The flame image written in the video memory 114 is compressed on the basis of a predetermined compression format by a compressing/stretching circuit 115. The compressed image is recorded, via a card interface 116, on the memory card 61 inserted in the card slot.

To reproduce a recorded image, an image recorded on the memory card 61 is read out via the card interface 116, stretched by the compressing/stretching circuit 115, and written into the video memory 114. The written image is input to the video signal processing circuit 106 and displayed on the display 108 or another image apparatus in the same manner as when image is monitored.

In this arrangement, mounted on the circuit board 100 are the card slot 102, image pickup device 104, analog amplifier (AMP), A/D converter (A/D), camera signal processing circuit 105, video signal processing circuit 106, display signal processing circuit 107, video driver 109, microcomputer 111, memory controller 113, video memory 114, compressing/stretching circuit 115, and card interface 116.

The card slot 102 need not be mounted on the circuit board 100, and can also be connected to the circuit board 100 by a connector cable or the like.

A power circuit 117 is also mounted on the circuit board 100. The power circuit 117 receives power from an external power source or battery and generates an internal power source voltage used inside the digital still camera 101. For example, a DC-DC converter can be used as the power circuit 117. The internal power source voltage is supplied to the respective circuits described above, and to a strobe 118 and the display 108.

As described above, the electric card according to this embodiment can be used in portable electric devices such as the digital still camera explained above. However, the electric card can also be used in various apparatus such as shown in FIGS. 18A to 18J, as well as in portable electric devices. That is, the electric card can also be used in a video camera shown in FIG. 18A, a television set shown in FIG. 18B, an audio apparatus shown in FIG. 18C, a game apparatus shown in FIG. 18D, an electric musical instrument shown in FIG. 18E, a cell phone shown in FIG. 18F, a personal computer shown in FIG. 18G, a personal digital assistant (PDA) shown in FIG. 18H, a voice recorder shown in FIG. 18I, and a PC card shown in FIG. 18J.

What is claimed is:

1. A semiconductor memory device, comprising:
   a semiconductor layer provided on an insulating substrate or an insulating layer;
   active areas each defined in the semiconductor layer with a device insulating film buried therein; and
   NAND cell units formed on the active areas, each NAND cell unit including a plurality of electrically rewritable and non-volatile memory cells connected in series, both ends of each NAND cell unit being coupled to a source line and a bit line, wherein
   the device performs such a carrier discharging operation as to set a state that the entire memory cells in the NAND cell unit are turned on; and then sequentially turn off the memory cells in the NAND cell unit from one disposed near one of a bit line contact and a source line contact and discharge the channel carriers to another one of the bit line and the source line.

2. The semiconductor memory device according to claim 1, wherein
   the carrier discharging operation is performed as following a write voltage application operation for a selected memory cell in the NAND cell unit.

3. The semiconductor memory device according to claim 1, wherein
   the carrier discharging operation is performed as following a read operation for a selected memory cell in the NAND cell unit.

4. The semiconductor memory device according to claim 1, wherein
   the carrier discharging operation is performed as a refresh operation, which is independent of data write and read operations.

5. A semiconductor memory device, comprising:
   a semiconductor layer provided on an insulating substrate or an insulating layer;
   active areas each defined in the semiconductor layer with a device insulating film buried therein; and
   NAND cell units formed on the active areas, each NAND cell unit including a plurality of electrically rewritable and non-volatile memory cells connected in series, both ends of each NAND cell unit being coupled to a source line and a bit line, wherein
   the device performs such a carrier discharging operation as to set a state that the entire memory cells in the NAND cell unit are turned on; and then sequentially turn off the memory cells two by two from ones disposed midway in the NAND cell unit and discharge the channel carriers to both of the bit line and the source line simultaneously.

6. The semiconductor memory device according to claim 5, wherein
   the carrier discharging operation is performed as following a write voltage application operation for a selected memory cell in the NAND cell unit.

7. The semiconductor memory device according to claim 5, wherein the carrier discharging operation is performed as following a read operation for a selected memory cell in the NAND cell unit.

8. The semiconductor memory device according to claim 5, wherein
   the carrier discharging operation is performed as a refresh operation, which is independent of data write and read operations.

9. A semiconductor memory device, comprising:
   a semiconductor layer provided on an insulating substrate or an insulating layer;
   active areas each defined in the semiconductor layer with a device insulating film buried therein;
   NAND cell units formed on the active areas, each NAND cell unit including a plurality of electrically rewritable and non-volatile memory cells connected in series;
   word lines each formed to couple control gates of the memory cells arranged in one direction in common;
   bit lines formed to be coupled to one ends of the NAND cell units via first select gate transistors; and
   a source line formed to be coupled to the other ends of the NAND cell units via second select gate transistors, wherein
   a carrier discharging operation is performed to discharge channel carriers in the NAND cell unit to at least one of the source line and the bit lines, and
   the carrier discharging operation is performed as follows: step down a selected word line to a write pass voltage from a write voltage; and then sequentially reset the word lines from one disposed near one of a bit line contact and a source line contact, thereby discharging the channel carriers to another one of the bit line and the source line.

10. The semiconductor memory device according to claim 9, wherein
    the carrier discharging operation is performed as following a write voltage application operation which is performed with the write voltage applied to the selected word line; and the write pass voltage to non-selected word lines.

11. The semiconductor memory device according to claim 9, wherein
    the carrier discharging operation is performed as following a read operation which is performed with read voltage applied to the selected word line; and read pass voltage to non-selected word lines.

12. The semiconductor memory device according to claim 9, wherein
the carrier discharging operation is performed as a refresh operation, which is independent of data write and read operations.

13. A semiconductor memory device, comprising:
a semiconductor layer provided on an insulating substrate or an insulating layer;
active areas each defined in the semiconductor layer with a device insulating film buried therein;
NAND cell units formed on the active areas, each NAND cell unit including a plurality of electrically rewritable and non-volatile memory cells connected in series;
word lines each formed to couple control gates of the memory cells arranged in one direction in common;
bit lines formed to be coupled to one ends of the NAND cell units via first select gate transistors; and
a source line formed to be coupled to the other ends of the NAND cell units via second select gate transistors, wherein
a carrier discharging operation is performed to discharge channel carriers in the NAND cell unit to at least one of the source line and the bit lines, and
the carrier discharging operation is performed as follows: step down a selected word line to a write pass voltage from a write voltage; and then sequentially reset the word lines two by two from ones disposed midway in the NAND cell unit, thereby discharging the channel carriers to the bit lines and the source line simultaneously.

14. The semiconductor memory device according to claim 13, wherein
the carrier discharging operation is performed as following a write voltage application operation which is performed with the write voltage applied to the selected word line; and the write pass voltage to non-selected word lines.

15. The semiconductor memory device according to claim 13, wherein
the carrier discharging operation is performed, as following a read operation which is performed with read voltage applied to the selected word line; and read pass voltage to non-selected word lines.

16. The semiconductor memory device according to claim 13, wherein
the carrier discharging operation is performed as a refresh operation, which is independent of data write and read operations.

* * * * *